(12) United States Patent
Kamarehi et al.

(10) Patent No.: US 6,263,830 B1
(45) Date of Patent: Jul. 24, 2001

(54) MICROWAVE CHOKE FOR REMOTE PLASMA GENERATOR

(75) Inventors: Mohammad Kamarehi, Pleasant Hill; Gerald M. Cox, Lafayette, both of CA (US)

(73) Assignee: Matrix Integrated Systems, Inc., Richmond, CA (US)

( * ) Notice: Subject to any disclaimer, the term of this patent is extended or adjusted under 35 U.S.C. 154(b) by 0 days.

(21) Appl. No.: 09/546,750

(22) Filed: Apr. 11, 2000

Related U.S. Application Data

(60) Provisional application No. 60/128,859, filed on Apr. 12, 1999.

(51) Int. Cl.$^7$ .............................. C23C 16/00; H05H 1/00; H05B 6/76
(52) U.S. Cl. .................. 118/723 MW; 118/723 ME; 118/723 MR; 156/345; 219/678; 219/738
(58) Field of Search .................. 118/723 MW, 118/723 ME, 723 MR; 156/345, 643.1; 219/678, 690, 738; 315/111.21; 438/727, 726; 216/69, 70; 204/298.38

(56) References Cited

U.S. PATENT DOCUMENTS

| Re. 32,664 | 5/1988 | Osepchuk et al. . |
| 3,584,177 | 6/1971 | Bucksbaum . |
| 3,819,900 | 6/1974 | Ironfield . |

(List continued on next page.)

FOREIGN PATENT DOCUMENTS

| 0 121 893 A2 | 4/1984 | (EP) . |
| 0 131 433 A2 | 7/1984 | (EP) . |
| 01 196 214 A2 | 3/1986 | (EP) . |
| 0 670 587 A1 | 2/1995 | (EP) . |
| 0 507 668 B1 | 3/1995 | (EP) . |
| 0 698 768 A1 | 2/1996 | (EP) . |
| 1-085654 | 3/1989 | (JP) . |

OTHER PUBLICATIONS

Pasierb et al., "Characterization of a novel microwave stripper", *J. Vac. Sci. Technol. A*, vol. 10, Issue 4, Jul./Aug. 1992, pp. 1096–1099.

*Primary Examiner*—Gregory Mills
*Assistant Examiner*—P. Hassanzadeh
(74) *Attorney, Agent, or Firm*—Knobbe, Martens, Olson & Bear LLP

(57) ABSTRACT

A remote plasma generator, coupling microwave frequency energy to a gas and delivering radicals to a downstream process chamber, includes several features which, in conjunction, enable highly efficient radical generation. In the illustrated embodiments, more efficient delivery of oxygen and fluorine radicals translates to more rapid photoresist etch or ash rates. A single-crystal, one-piece sapphire applicator and transport tube minimizes recombination of radicals in route to the process chamber and includes a bend to avoid direct line of sight from the glow discharge to the downstream process chamber. Microwave transparent cooling fluid within a cooling jacket around the applicator enables high power, high temperature plasma production. Additionally, dynamic impedance matching via a sliding short at the terminus of the microwave cavity reduces power loss through reflected energy. At the same time, a low profile microwave trap produces a more dense plasma to increase radical production. In one embodiment, fluorine and oxygen radicals are separately generated and mixed just upstream of the process chamber, enabling individually optimized radical generation of the two species.

25 Claims, 14 Drawing Sheets

U.S. PATENT DOCUMENTS

| | | |
|---|---|---|
| 3,872,349 | 3/1975 | Spero et al. . |
| 3,878,350 | 4/1975 | Takagi . |
| 3,882,352 | 5/1975 | Osepchuk et al. . |
| 4,023,279 | 5/1977 | Janda . |
| 4,096,369 | 6/1978 | Tanaka et al. . |
| 4,137,441 | 1/1979 | Bucksbaum . |
| 4,137,442 | 1/1979 | Tateda . |
| 4,191,877 * | 3/1980 | Tanaka et al. .................. 219/685 |
| 4,207,452 | 6/1980 | Arai . |
| 4,326,114 | 4/1982 | Gerling et al. . |
| 4,477,706 | 10/1984 | Mittelsteadt . |
| 4,511,779 | 4/1985 | Bucksbaum et al. . |
| 4,513,513 | 4/1985 | Sayles . |
| 4,728,763 | 3/1988 | Bell et al. . |
| 4,761,529 | 8/1988 | Tsisios . |
| 4,771,145 | 9/1988 | Davis, Jr. . |
| 4,844,773 | 7/1989 | Lowenstein et al. . |
| 4,866,346 | 9/1989 | Gaudreau et al. . |
| 5,013,400 | 5/1991 | Kurasaki et al. . |
| 5,063,329 | 11/1991 | Okamoto . |
| 5,082,517 | 1/1992 | Moslehi . |
| 5,147,993 | 9/1992 | Braun et al. . |
| 5,211,808 | 5/1993 | Vilardi et al. . |
| 5,262,610 | 11/1993 | Huang et al. . |
| 5,498,308 | 3/1996 | Kamarehi et al. . |
| 5,501,740 | 3/1996 | Bessen et al. .................. 118/723 |
| 5,556,475 | 9/1996 | Besen et al. . |
| 5,556,566 | 9/1996 | Cappello et al. . |
| 5,800,618 | 9/1998 | Niori et al. .................. 118/723 E |
| 5,892,328 | 4/1999 | Shang et al. . |
| 5,942,144 * | 8/1999 | Lee .................. 219/738 |
| 6,015,761 | 1/2000 | Merry et al. . |

* cited by examiner

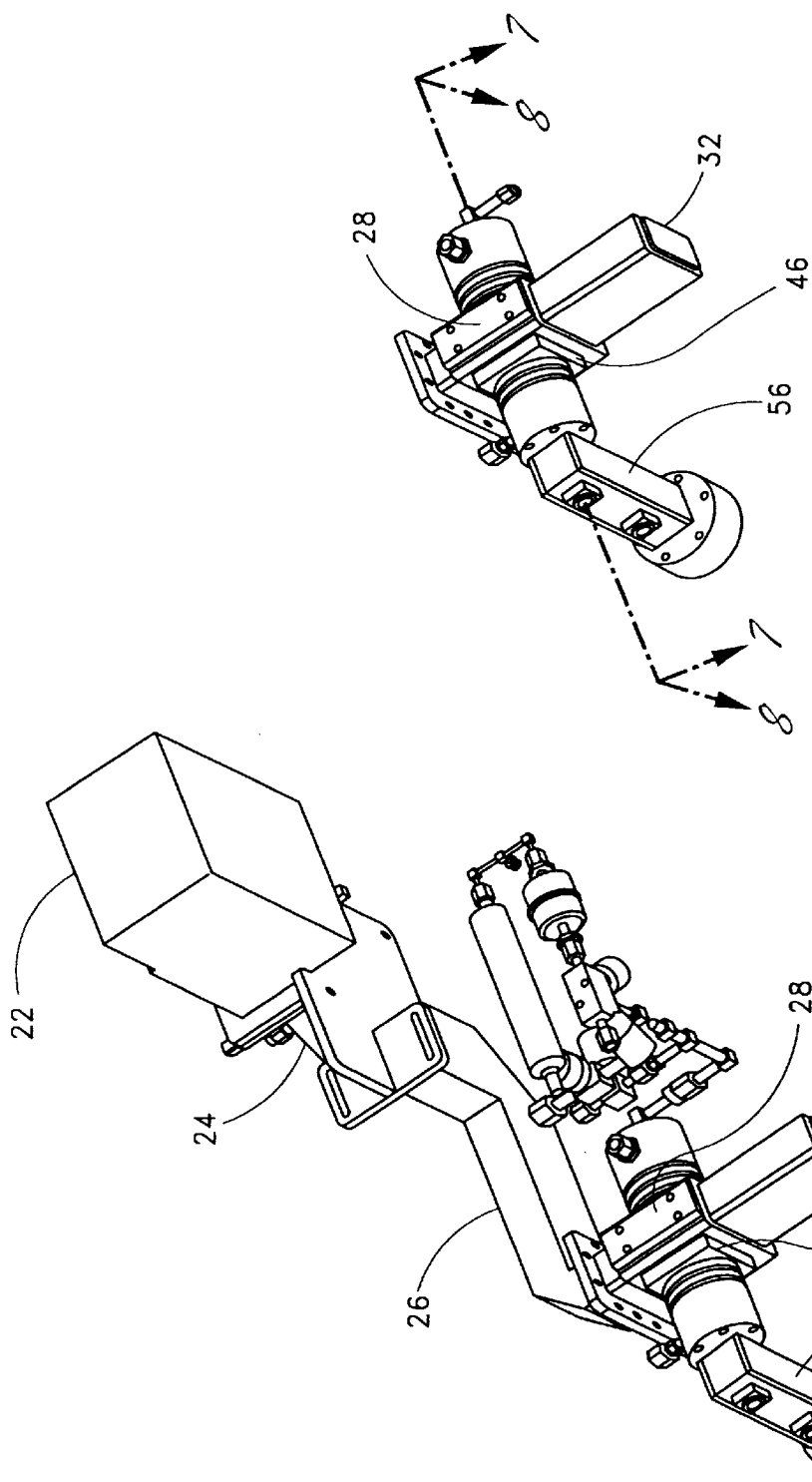

MICROWAVE CHOKE FOR REMOTE PLASMA GENERATOR

REFERENCE TO RELATED APPLICATION

This application claims the priority benefit under 35 U.S.C. § 119(e) from provisional application No. 60/128,859 of Kamarehi et al., filed Apr. 12, 1999.

FIELD OF THE INVENTION

The present invention relates generally to remote plasma generators, for semiconductor processing equipment, and more particularly to microwave power plasma generators for ashing or stripping photoresist and removing polymeric residue from semiconductor substrates.

BACKGROUND OF THE INVENTION

In fabricating integrated circuits, photoresist is coated over semiconductor substrates and patterned through selective exposure to developing light and removal of either the developed or undeveloped portions. The patterned resist forms a mask used to extend the pattern into underlying layers, such as oxides or metal layers, by etching through the holes in the mask. Masks are also commonly used to selectively dope regions of the substrate by ion implantation. Once the mask has been employed, it is typically removed by an oxidation process. The oxidizing process is referred to in the industry as resist "stripping" or "ashing."

Increased throughput is a primary objective in the semiconductor industry, particularly in the current era of single-wafer processing. Any reduction in the time required for processing each substrate serially in single-wafer processing systems can lead to significant cost savings in a highly competitive industry. In the case of resist stripping, the rate of processing can be increased by supplying reactive oxygen free radicals to the substrate. For example, dissociation of oxygen-containing gases, such as diatomic oxygen gas ($O_2$), results in atomic oxygen (O), also known as oxygen free radicals.

The addition of fluorine, in the form of $NF_3$, $CF_4$, $SF_6$ or fluorine free radicals (F), often aids the stripping process where resist chemistry has been complicated by prior processing. For example, it is difficult to remove photoresist that has been subjected to ion implantation, such as that employed in electrically doping the semiconductor substrate through the mask. Similarly, reactive ion etch (RIE) through resist masks, particularly where metal is exposed during the etch, tends to form polymeric residue, which is also difficult to remove by oxidation alone. In each of these situations, application of fluorinated chemistries aids cleaning the resist and residue from the substrate. Fluorine is also commonly used in other cleaning or etching steps.

Maximizing the generation of oxygen (and/or fluorine) free radicals positively influences the rate at which resist can be stripped, thus increasing substrate throughput. Such free radicals are commonly produced by coupling energy from a microwave power source to oxygen-containing gas. Remote microwave plasma generators guide microwave energy produced in a magnetron through a waveguide to a resonant cavity or "applicator," where the energy is coupled to a gas flowing through the cavity. The gas is excited, thereby forming oxygen free radicals (O). Fluorine free radicals (F) are similarly formed when fluorine source gas is added to the flow. Common source gases include $O_2$ for providing O, and $NF_3$, $CF_4$, $SF_6$ or $C_2F_6$ for providing F. Nitrogen ($N_2$) forming gas ($N_2/H_2$) is often added to the flow to increase particle kinetics and thereby improve the efficiency of radical generation.

While microwave radical generators can lead to significant improvements in ash rates, conventional technology remains somewhat limiting. The plasma ignited by the microwave power, for example, includes highly energetic ions, electrons and free radicals (e.g., O, F, N). While O and F free radicals are desirable for stripping and cleaning resist from the substrate, direct contact with other constituents of the plasma can damage the substrate and the process chamber. Additionally, the plasma emits ultraviolet (UV) radiation, which is also harmful to structures on the substrate.

Direct contact between the plasma and the process chamber can be avoided by providing a transport tube between the microwave cavity or applicator and the process chamber. The length of the tube is selected to encourage recombination of the more energetic particles along the length of the tube, forming stable, less damaging atoms and compounds. Less reactive F and O radicals reach the process chamber downstream of the microwave plasma source in greater proportions than the ions. Because the process chamber is located downstream of the plasma source, this arrangement is known as a chemical downstream etch (CDE) reactor. By creating a bend in the tube, the process chamber is kept out of direct line of sight with the plasma, such that harmful UV radiation from the glow discharge does not reach the substrate.

The tube itself, however, places several limitations on the CDE reactor. Conventionally, both the applicator and the transport tube are formed of quartz. Quartz exhibits advantageously low rates of O and F recombination, permitting these desired radicals to reach the process chamber while ions generated in the plasma source recombine. Unfortunately, quartz is highly susceptible to fluorine attack. Thus, the quartz transport tube and particularly the quartz applicator, which is subject to direct contact with the plasma, deteriorates rapidly and must be frequently replaced. Each replacement of the quartz tubing not only incurs the cost of the tubing itself, but more importantly leads to reactor downtime during tube replacement, and consequent reduction in substrate throughput.

An alternative material for applicators and/or transport tubes is sapphire ($Al_2O_3$). While highly resistant to fluorine attack, sapphire tubes have their own shortcomings. For example, sapphire transport tubes exhibit much higher rates of O and F recombination as compared to quartz, resulting in lower ash rates. Additionally, sapphire is susceptible to cracking due to thermal stresses created by the energetic plasma, limiting the power which can be safely employed. Lower plasma power means less generation of free radicals, which in turn also reduces the ash rate. While employing single-crystal sapphire somewhat improves the strength of the tube relative to polycrystalline sapphire, safe power levels for single-crystal sapphire are still low compared to those which can be employed for quartz tubes. Moreover, bonding material at the joint between sapphire sections that create the bend in the transport tube, which prevents UV radiation from reaching the process chamber, is typically as susceptible to fluorine ion attack as is quartz.

Other limitations on the production of radicals in a conventional microwave plasma generator relate to the efficiency of the energy coupling mechanism. Much of the microwave power supplied by the magnetron is lost in power reflected back up the waveguide, where it is absorbed by an isolator module designed to protect the magnetron.

Energy also escapes where the applicator carries source gas in and free radicals out of the resonant cavity. The plasma-filled tube acts as a conductor along which microwave energy travels out of the cavity, thus effectively extending the plasma and reducing plasma density. In addition to reducing plasma density, and therefore reducing generation of radicals, the extension of the plasma also increases the risk of ions surviving to reach the process chamber and substrate housed therein. Microwave traps can confine such microwave leakage. For example, U.S. Pat. No. 5,498,308 to Kamarehi et al., entitled "Plasma Asher with Microwave Trap," discloses a resonant circuit trap. Even employing such traps, however, the plasma expands outside the plasma source cavity along the tube to the outer edges of the traps.

Accordingly, a need exists for more efficient microwave generators to improve resist ash rates.

SUMMARY OF THE INVENTION

In satisfaction of this need, a remote plasma generator is provided for coupling microwave frequency energy to a gas and delivering radicals to a downstream process chamber. The plasma generator includes several features which, in conjunction, enable highly efficient radical generation and consequently high photoresist ash rate. Such high ash rates can be achieved for both standard photoresist and chemically more problematic residues, such as those created by ion implantation and reactive ion etching.

In accordance with one aspect of the invention, high power can be coupled to gas flow that includes a fluorinated chemistry. A single-crystal, one-piece sapphire applicator and transport tube resists fluorine attack. The tube can be lengthened and provided with an elbow joint, aiding recombination of ions and protecting the process chamber from UV radiation produced in the plasma discharge.

In accordance with another aspect of the invention, microwave transparent cooling fluid enables high power, high temperature plasma production. While useful for increasing practicable power for applicators of any material, liquid cooling is of particular utility in conjunction with sapphire applicators, which are susceptible to stress cracking.

In accordance with still another aspect of the invention, dynamic impedance matching via a sliding short at the terminus of a microwave cavity reduces power loss through reflected energy. At the same time, a low profile microwave trap produces a more dense plasma to increase radical production.

In accordance with yet another aspect of the invention, different radicals are separately generated and mixed just upstream of the process chamber, enabling individually optimized radical generation of the two species. In the illustrated embodiment, fluorine radicals are generated in a sapphire applicator, while oxygen radicals are generated in a quartz applicator.

BRIEF DESCRIPTION OF THE DRAWINGS

These and other aspects of the invention will be apparent from the detailed description below, and from the appended drawings, which are intended to illustrate and not to limit the invention, and wherein:

FIG. 3 is a left, front and top perspective view of the plasma generator of FIG. 2;

FIG. 4 shows a subsystem of the plasma generator of FIG. 3;

DETAILED DESCRIPTION OF THE PREFERRED EMBODIMENTS

While the illustrated embodiments are described in the context of a resist stripping or ashing system, the skilled artisan will readily find application for the devices and methods disclosed herein for other systems. Within the semiconductor industry, for example, plasma or free radical generation is desirable for assisting or enhancing many chemical etch and chemical vapor deposition processes. For many of these processes, remote production of plasmas advantageously avoids damage to the substrate.

Figure 1:
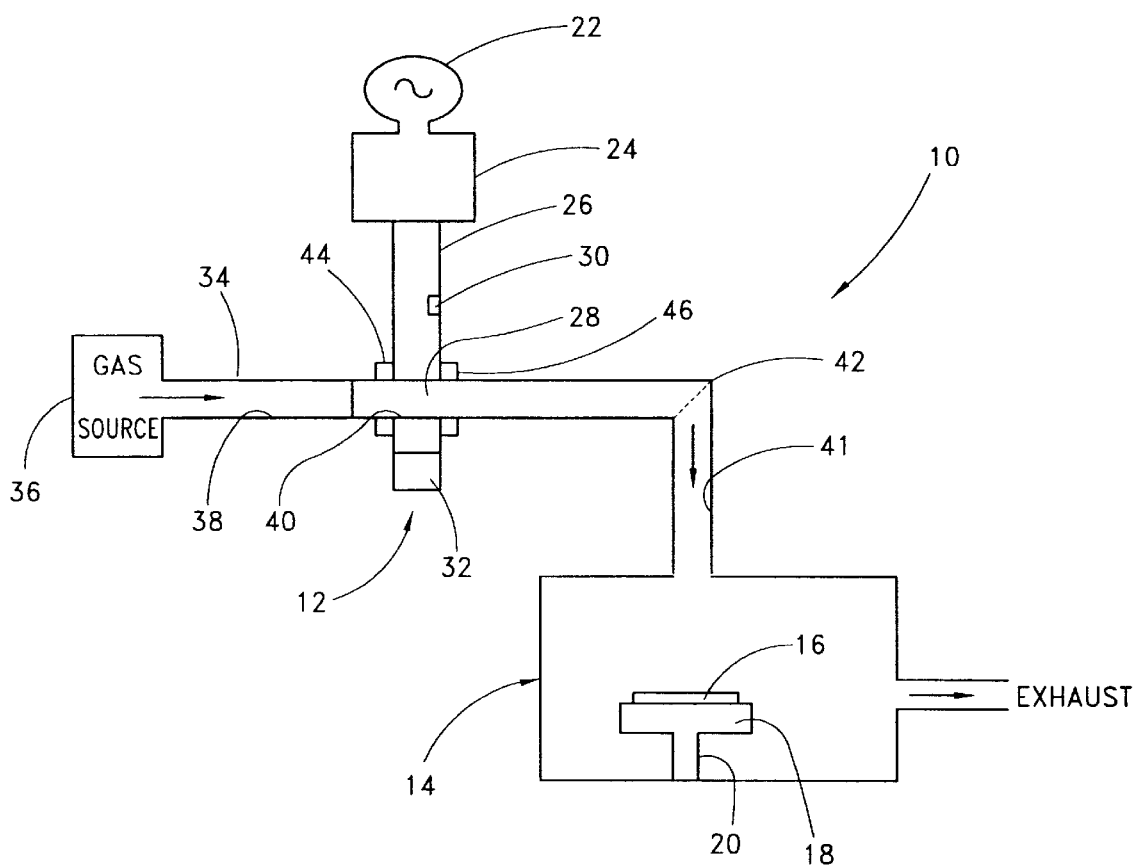
FIG. 1 is a schematic view of a semiconductor reactor incorporating a remote microwave plasma generator, constructed in accordance with a preferred embodiment of the present invention.

With reference initially to FIG. 1, a chemical downstream etch (CDE) reactor 10, according to a preferred embodiment, is schematically illustrated. The reactor 10 includes a microwave plasma generator 12 upstream of a process chamber 14. A substrate 16, typically comprising a monolithic semiconductor wafer, is supported upon a chuck 18 over a pedestal 20 within the chamber 14.

With reference to FIGS. 1–4, the plasma generator 12 includes a microwave power source 22, which can be a conventional magnetron. For example, suitable microwave power sources are commercially available under the trade names NL10230 and NL 10250 from Richardson Electronics of LaFox, Ill. The NL 10230 magnetron generator is capable of producing about 3,000 W of microwave power at 2,450 MHz (nominal). The skilled artisan will readily appreciate that, in other arrangements, the power source can be of any construction suitable for coupling power to a gas. Other plasma generators, for example, can employ radio frequency power, and energy can be coupled inductively or capacitively to the gas being ionized.

The illustrated plasma generator 12 further includes, adjacent the power source 22, an isolator module 24, which can also be of conventional construction. As is known in the field, the isolator 24 protects the magnetron from reflected power by diverting such reflected power to a dummy load. Desirably, the isolator 24 includes an integrated directional coupler, which also measures reflected power in order to match impedance along the microwave energy pathway, as will be discussed in more detail with respect to the section entitled "Impedance Matching," below.

Microwave power is directed through the isolator 24 to a waveguide 26, which extends into a microwave cavity or plasma source 28. As best seen from FIG. 2, the illustrated waveguide 26 is S-shaped, enabling a stacked configuration and reducing reactor footprint on the fabrication floor. The waveguide includes a fixed tuning knob 30 (FIG. 1), which operates in conjunction with an autotuner module 32 to match impedance of the microwave energy path (including the isolator 24, waveguide 26 and cavity 28) to that of the power source 22. The autotuner module 32 is described in more detail in the section entitled "Impedance Matching," below.

A gas carrier tube 34 extends from a gas source 36 through the microwave cavity 28. The tube 34 axis extends transversely to the waveguide axis. In the illustrated embodiment, the gas source includes an oxygen source gas (preferably $O_2$), a fluorine source gas (preferably $CF_4$ or $NF_3$), and a carrier gas (preferably $N_2$). As discussed in more detail in the section entitled "Single-Crystal Transport Tube," below, the carrier tube 34 includes an upstream section 38, an applicator section 40, and a transport tube section 41. The transport tube 41 includes a bend or elbow joint 42 between the cavity 28 and the process chamber 14.

A pair of microwave emission barriers 44, 46, surrounding the applicator 40 immediately upstream and downstream of the cavity 28, respectively, serve to prevent microwave energy escaping the cavity 28. The construction of the emission barriers 44, 46 is discussed in more detail in the section entitled "Microwave Choke," below.

Single-crystal Transport Tube

Referring to FIG. 1, as briefly noted above, the gas carrier tube 34 includes three sections: the upstream section 38, carrying gas from the gas source 36; the applicator section 40, extending through the microwave cavity 28; and the transport tube section 41, extending downstream of the cavity 28 to the process chamber 14.

In operation, microwave power conducted from the waveguide 26 is coupled to gas flowing through the applicator portion 40 of the tube 34 (within the cavity 28), exciting, the gas and igniting, a plasma. The applicator 40, including portions of the tube 34 within the cavity 28 as well as sections immediately adjacent the cavity 28, is directly subjected to energetic particles of the plasma discharge and are consequently subject to faster deterioration than upstream portions, and slightly faster than downstream portions. Since the upstream section 38 of the tube 34 is not subject to the plasma discharge and therefore does not deteriorate rapidly, the upstream section 38 is preferably a conventional stainless steel gas line and is provided separately from applicator 40, such that it need not be replaced when the applicator 40 is due for replacement.

In the illustrated embodiment, both fluorine and oxygen source gases are provided to the applicator 40, generating O and F free radicals as well as a variety of ionic species and electrons. As noted in the Background section above, fluorine is particularly corrosive to quartz tubing. Accordingly, the applicator 40 preferably comprises sapphire for resistance to fluorine attack. Most preferably, the applicator 40 is formed of single-crystal sapphire, providing superior physical strength to withstand the stresses generated by exposure to the plasma.

As discussed in the Background section above, the length of the transport section 41 of the carrier tube 34 is selected to allow recombination of ions prior to introduction of the energized gas to the process chamber 14. Preferably, the transport section 41, from the end of the microwave cavity 28 to the process chamber 14, is at least about 5 inches long, more preferably at least about 10 inches, and is about 14.5 inches in the illustrated embodiment. The total length of the applicator 40 and transport section 41 is about 21.5 inches in the illustrated embodiment. The skilled artisan will understand, however, that shorter lengths of transport tubing can be used where ion content is reduced in alternative manners.

Figure 7:
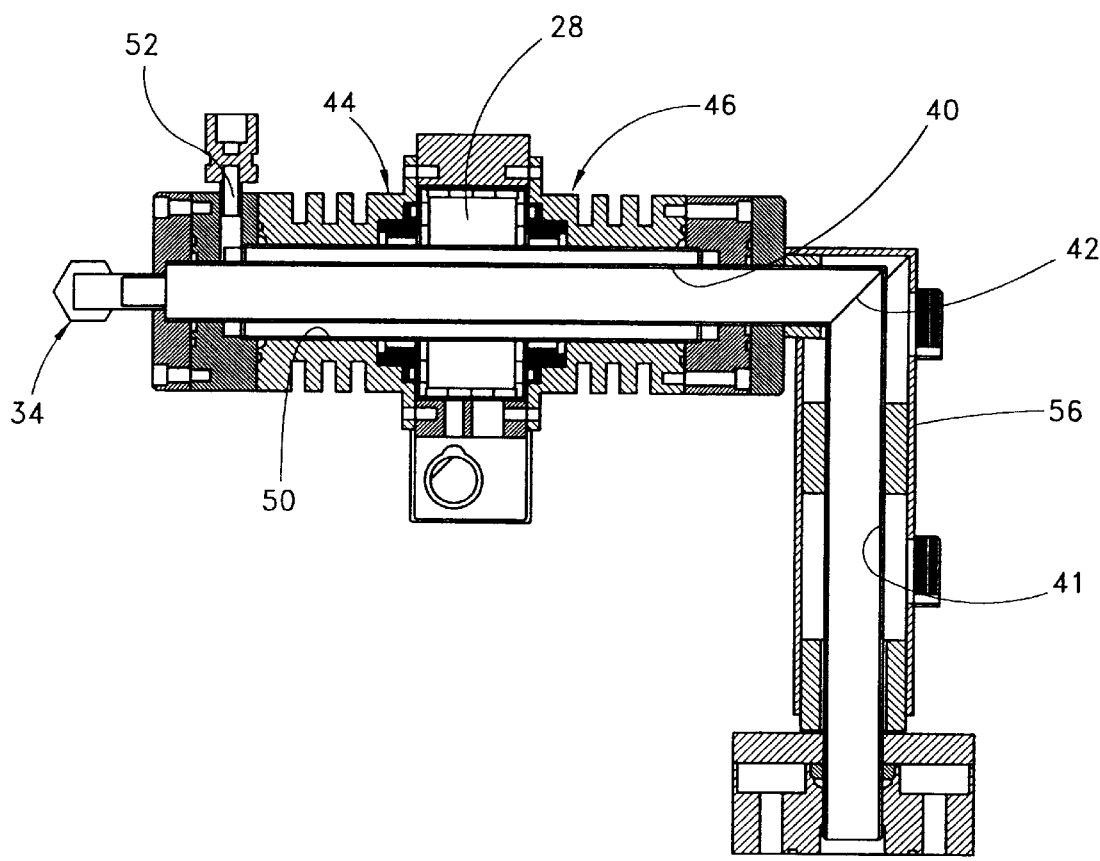
FIG. 7 is a side sectional view of the subsystem, taken along lines 7—7 of FIG. 4.

The transport section 41 preferably includes the bend or elbow joint 42, best seen in FIG. 7, thus avoiding direct line of sight between the glow discharge within the cavity 28 and the process chamber 14 (FIG. 1). Preferably, the bend 42 defines at least a 35° angle, and more preferably greater than about a 45° angle. In the illustrated embodiment, the bend 42 defines a 90° or right angle. The substrate 16 is thus shielded from harmful UV photons released by the glow discharge.

As the transport tube 41 is also subjected to energetic plasma products, including excited fluorine species, this section is also preferably formed of sapphire, and more preferably single-crystal sapphire. Additionally, the transport tube 41 is preferably formed integrally with the applicator tube 40.

Unfortunately, the crystalline quality of sapphire tends to degrade for tube lengths over 12 inches. As previously noted, the resultant polycrystalline structure of longer lengths of sapphire tubing is susceptible to stress cracking when subjected to high power, high temperature plasmas. The desirability of forming an elbow joint within the transport tube section 41 also necessitates joining at least two sections of single-crystal sapphire. Typical bonding materials, however, are incompatible with fluorine, such that employing such bonds would negate the very advantage of sapphire tubing.

Accordingly, the illustrated transport tube 41 and applicator 40 are provided as sections of single-crystal sapphire, bonded at the elbow joint 42 without bonding materials susceptible to fluorine attack. In particular, the sections 40 and 41 are bonded by eutectic bonding, as disclosed in PCT publication number WO 09 856 575, entitled Eutectic Bonding of Single Crystal Components, published Dec. 17, 1998 (the "PCT application"). The disclosure of the PCT '575 application publication is incorporated herein by reference. Single-crystal sections pre-bonded in the manner of the PCT '575 application are available from Saphikon, Inc. of Milford, N.H.

Applicator Cooling System

The employment of single-crystal sapphire provides resistance to fluorine attack and greater strength than polycrystalline sapphire. Accordingly, the single-crystal sapphire tube, serving as an integral applicator 40 and transport tube 41, enables coupling relatively high power to the gas, while withstanding fluorine attack for applications such as post-implantation ashing.

Coupling high power to the gas desirably increases the rate of O and/or F radical production, thereby increasing ash rates. However, the kinetic energy created in a high power plasma introduces negative effects as well. Within the cavity 28, rapid and frequent collisions between energized particles, and between such particles and the applicator walls, raises the temperature of the applicator 40, creating thermal stresses on the tube. While single-crystal sapphire is more resistant to such stresses than polycrystalline sapphire, sapphire remains subject to stress cracking under high power, high temperature operation, as compared to quartz. Moreover, the high temperature of the applicator 40 encourages recombination of dissociated particles. While recombination of ions and electrons is desirable, recombination of free radicals (F, O) is counterproductive.

Accordingly, the preferred embodiments employ a cooling mechanism within the applicator 40, thereby reducing kinetically-induced recombination within the applicator 40. Lengthening the transport tube 41 compensates for reduced ion recombination within the applicator 40. Energetic ions recombine over the length of the transport tube 41 in greater proportions than radicals, due to additional electrostatic reactions encouraging such recombination. At the same time, cooling the applicator 40 enables use of higher power for a given tolerance for thermal stress. For sapphire applicators, in particular, the cooling mechanism reduces the occurrence of stress cracking while boosting the efficiency of free radical generation.

Figure 8:
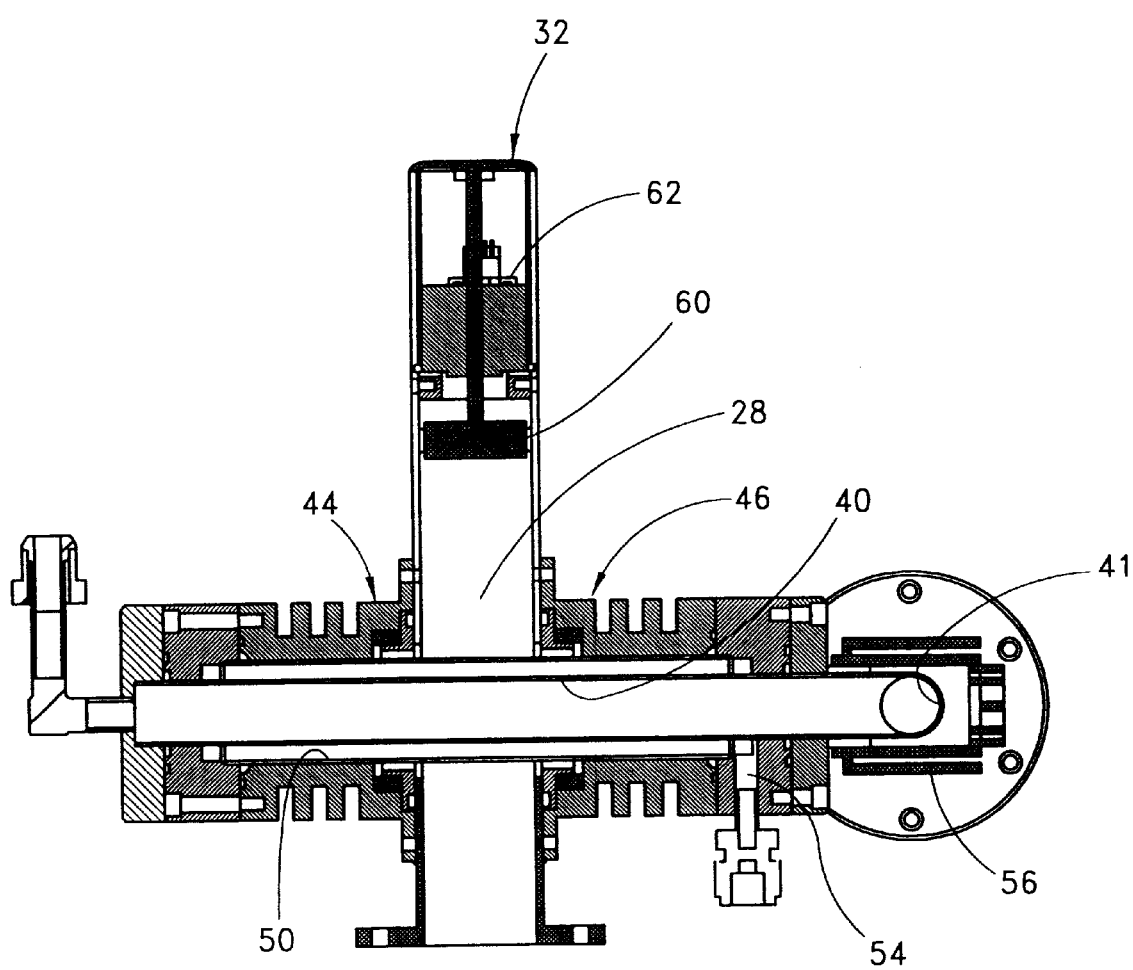
FIG. 8 is a top down sectional view of the subsystem, taken along lines 8—8 of FIG. 4.

With reference to FIGS. 7 and 8, a cooling jacket 50 surrounds the applicator section 40 of the carrier tube 34. The space between the jacket 50 and the applicator 40 is filled with a coolant fluid. Advantageously, the fluid is circulated through the jacket 50, entering at a fluid inlet 52 (FIG. 7) and exiting at a fluid outlet 54 (FIG. 8). The inlet 52 and outlet 54 are arranged at 90° to one another, to encourage circumferential circulation of the fluid. The cooling jacket 50 preferably extends upstream and downstream of the microwave cavity 28, as shown.

Desirably, both the jacket 50 and the cooling fluid comprise microwave transparent materials, thus maximizing microwave energy coupling to the gas within the applicator 40, rather than direct absorption by the jacket 50 and coolant. The cooling jacket 50 preferably comprises quartz.

The coolant fluid is selected to have minimal hydrogen (H) content, which readily absorb microwave energy. Preferably, the coolant contains no hydrogen, and in the illustrated embodiment comprises a perfluorinated, inert heat transfer fluid. Such fluids are available from the Kurt J. Lesker Company of Clairton, Pa. under the trade name Galden™. Advantageously, this liquid coolant is available in multiple formulations having different boiling points. Thus, the most appropriate formulation can be selected for cooling the microwave applicator, depending upon the desired parameters for operating the microwave plasma generator.

Accordingly, recombination of desirable radicals within the applicator 40 is reduced by provision of liquid cooling of the applicator 40. Moreover, greater power can be coupled to the gas without damage to the applicator 40. In the illustrated embodiment, the power source 22 can be operated at full power (about 3,000 W) under normal operating conditions (i.e., continuous or intermittent operation while sequentially ashing photoresist from multiple wafers), without inducing stress cracks in the sapphire applicator 40. It will be understood that improved power tolerance, and hence more efficient radical production, are also applicable to quartz applicators, which are generally more desirable for non-fluorinated chemistries. It will be understood that operable power levels may be considerably higher for quartz applicators with liquid cooling.

To a lesser extent, the downstream transport tube 41 is also heated by exposure to plasma by-products. The downstream tube, however, is not directly contacted by the glow discharge. Rather than liquid cooling the transport tube 41, therefore, the preferred embodiments provide an insulated shroud 56 around the tube, as shown in FIGS. 2–4 and 6, reducing risk of burns to technicians. Preferably, fans direct air through the insulated shroud 56, cooling the transport tube 41 by convection.

Impedance Matching

Figure 2:
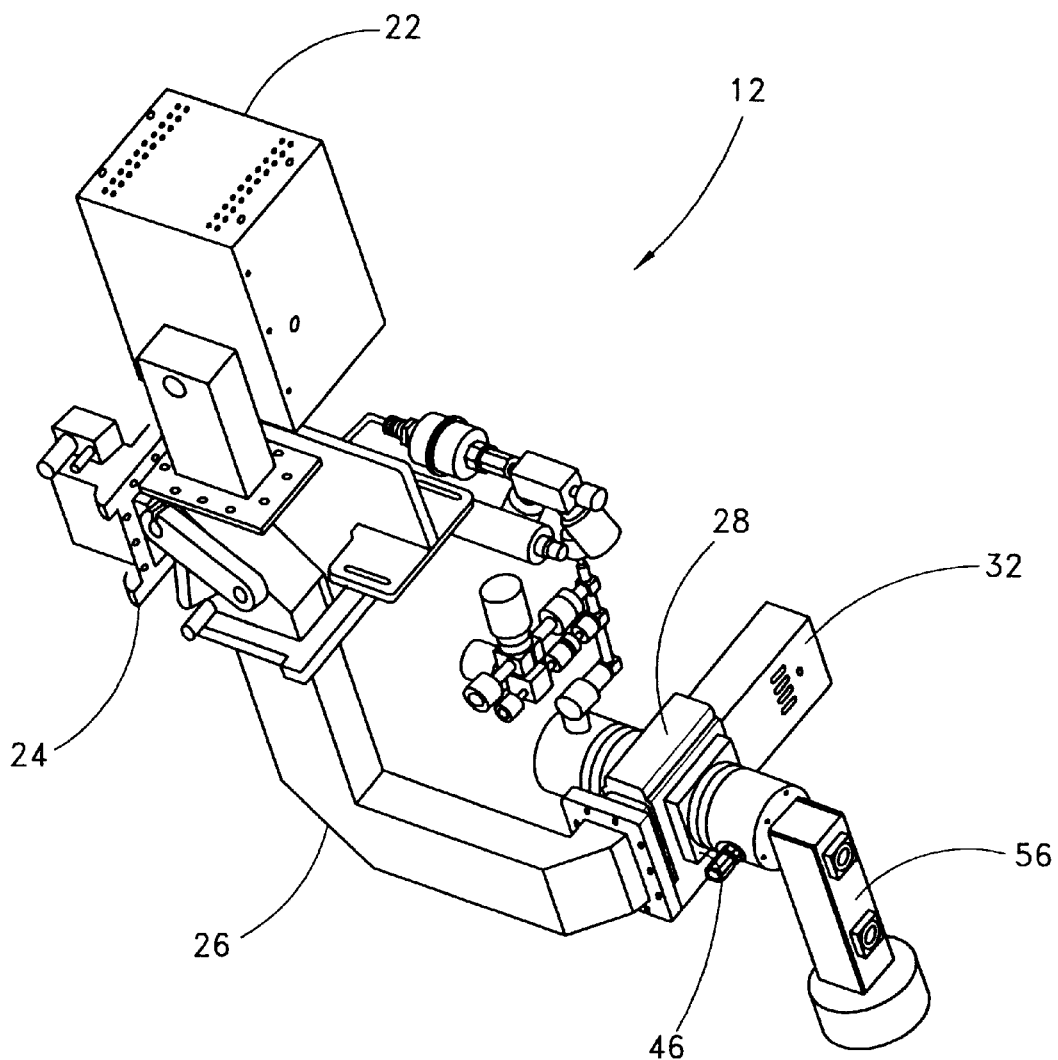
FIG. 2 is a right, front and top perspective view of a plasma generator, constructed in accordance with the preferred embodiment.
Figure 6:
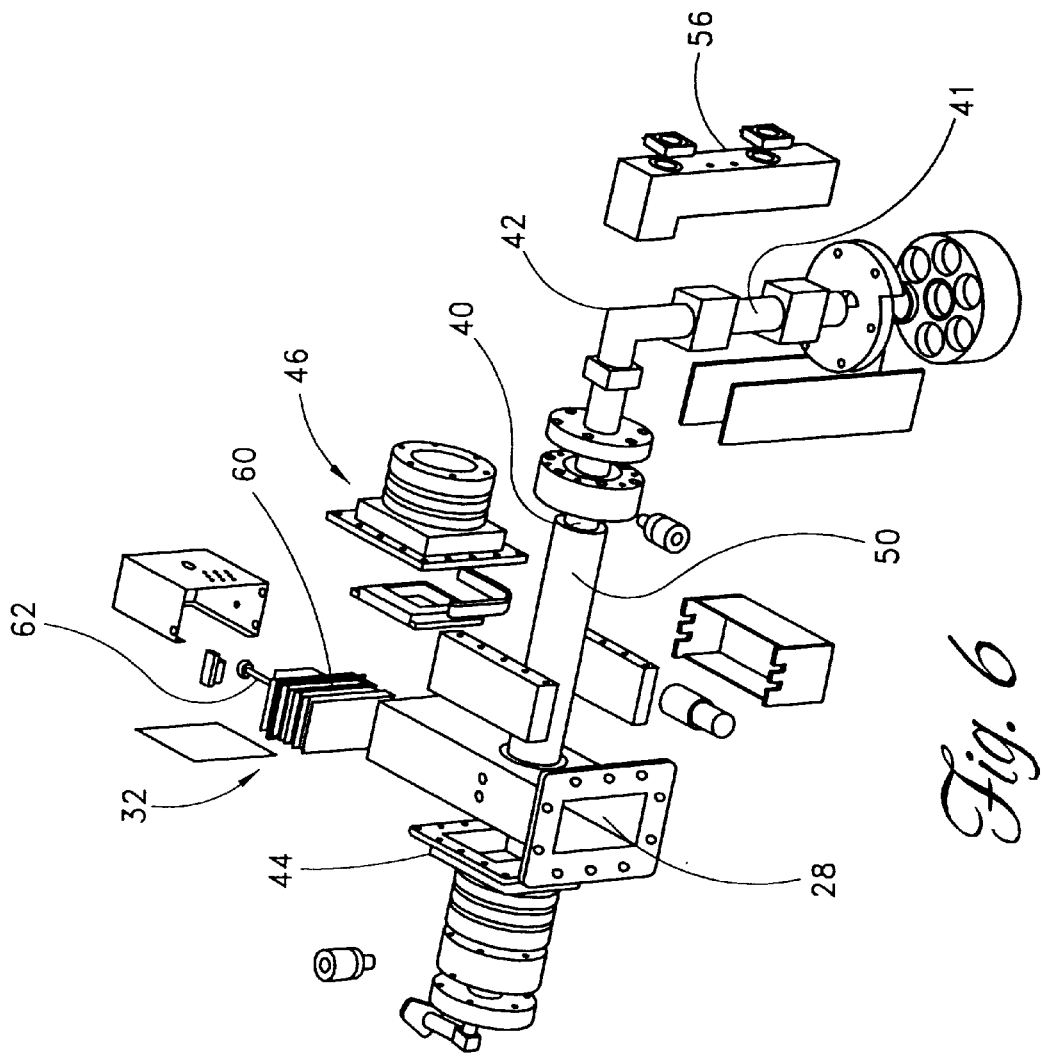
FIG. 6 is an exploded view of the subsystem of FIG. 4, taken from the angle of FIG. 5.
Figure 5:
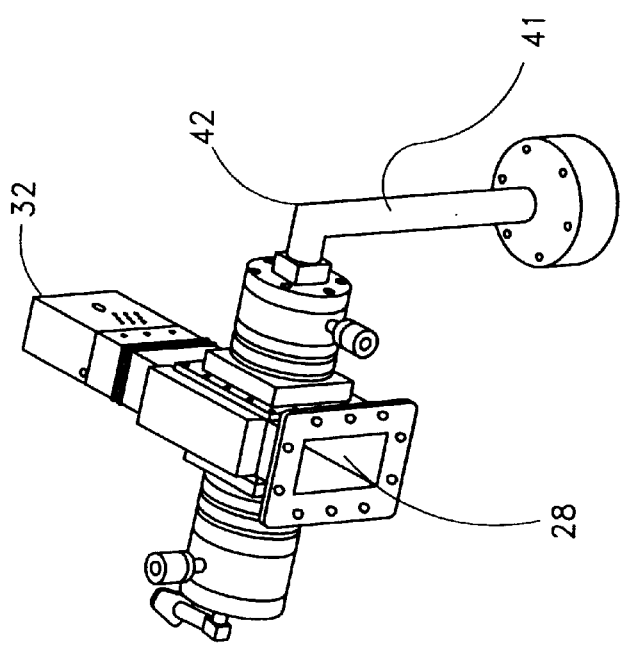
FIG. 5 is a right, front and top perspective view of the subsystem of FIG. 4, shown with a protective sheath removed from a carrier tube.

With reference to FIGS. 1–3, the microwave energy generated by the power source 22 is propagated through an energy path including the isolator 24, waveguide 26 and microwave cavity 28. The impedance of the various sections of the energy path should be closely matched to avoid energy loss through reflected power. By careful impedance matching, a standing wave or resonant condition is created in the microwave waveguide system 26, 28, where the power is coupled to gas flowing through the applicator 40. While the power source is protected from reflected energy by the isolator 24, reflected energy absorbed by the dummy load in the isolator 24 represents wasted power that would otherwise be available for radical generation.

Impedance matching is complicated by the fact that the medium within which the microwaves propagate is of variable composition. The density and conductivity of gas flowing through the microwave cavity 28 varies with different process recipes. Since a reactor is typically utilized repetitively for the same recipe by a semiconductor manufacturer, impedance matching is typically performed for a given process recipe. Tuning the impedance of the waveguide 26 (including the cavity 28) is thus necessary when the reactor is first shipped to the manufacturer, as well as each time the process recipe is changed.

A common method of tuning impedance of the waveguide 26 is by employing three tuning knobs within the waveguide 26. By adjusting the amount of protrusion of these conductors transversely across the waveguide 26 at three different locations along the energy propagation axis, impedance of the waveguide 26 can be matched to that of the isolator 24 and power source 22, thus minimizing reflected power for a given process recipe. This manner of impedance matching is known as a triple stub tuner. While effective in minimizing reflected power, triple stub tuners are expensive.

In the preferred embodiments, however, impedance matching is controlled by the combination of a fixed tuning knob 30 (FIG. 1) within the waveguide 26 and a sliding short 60, shown in FIG. 8. The tuning knob 30 is preferably factory preset for gross tuning, while the sliding short 60 dynamically fine tunes the impedance matching.

The sliding short 60 is driven by a motor actuator 62 within the autotuner module 32. The sliding short 60 comprises a conductor which extends across the walls of the microwave cavity 28, thus providing a movable end wall for the cavity 28. The position of the sliding short 60 can be changed until impedance of the waveguide 26 (including the microwave cavity 28) closely matches that of the isolator 24, at which point a resonant condition is achieved within the cavity 28. Moreover, adjustment of the sliding short 60 along the energy propagation axis, in place of transverse movement of a triple stub tuner in the waveguide 26, facilitates arranging the standing wave pattern to optimize coupling of energy to the gases flowing through the applicator 40.

Moreover, as the name implies, the autotuner 32 matches impedance dynamically via closed loop control. Reflected power is continually measured at the isolator module 24

(FIGS. 1–3) and sends signals to an electronic controller (not shown). The controller, in turn, sends signals to the motor actuator 62, which drives the sliding short 60. After the sliding short 60 moves, the change in reflected power is recognized by the controller, which then further adjusts the position of the sliding short 60, and so on until reflected power is minimized.

In the illustrated embodiment, the sliding short 60 is initially positioned one half of the microwave energy wavelength (as measured in the waveguide system) from the center of the applicator 40 running through the cavity 28. In this position, the magnetic field is maximum, and a generally low electric field strength reduces damage from ion acceleration downstream. If necessary, the short 60 can be moved to one quarter of the microwave energy wavelength for initial ignition and then moved to one half wavelength after the plasma is essentially self-supporting. The motor actuator 62 preferably enables deviation forward or back from this default position by up to about 0.25 inch, more preferably up to about 0.5 inch, and in the illustrated embodiment, the sliding short 60 is movable by about 0.75 inch to either side of the default (½ wavelength) position. In another embodiment, the actuator 62 enables deviation from the default position of up to a half wavelength in either direction (±1.7 inches), for fully adjustable impedance matching. The autotuner module 32 further includes optical sensors to prevent over-movement of the sliding short 60. It has been found that, not only does the above-described arrangement (short 60 at λ/2 from applicator center) minimize reflected power, but it also maximizes microwave magnetic field intensity within the applicator.

Figure 9:
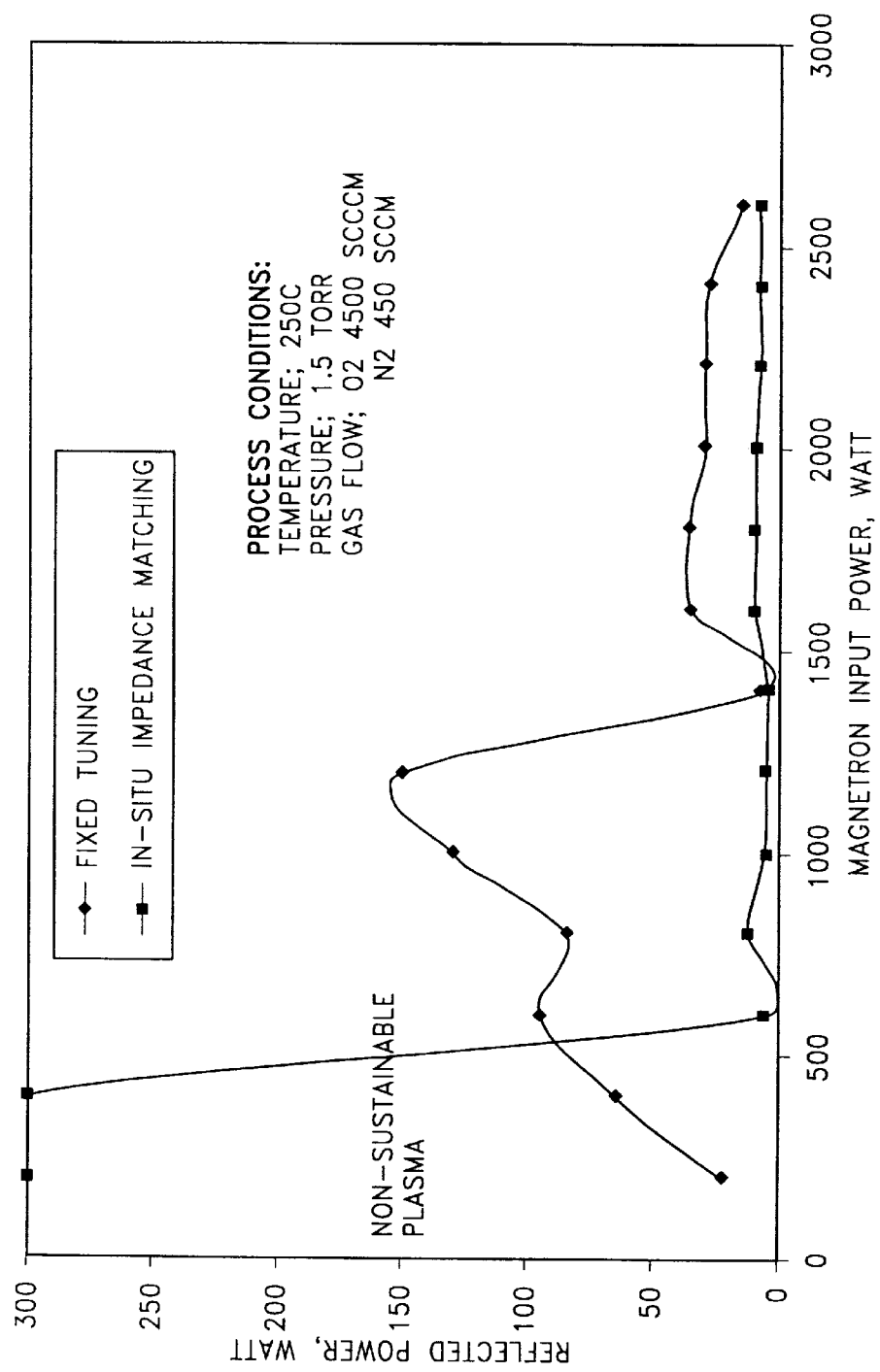
FIG. 9 is a graph illustrating reflected power against microwave generator power, for both fixed tuning and dynamically or in-situ tuned impedance matching.
Figure 10:
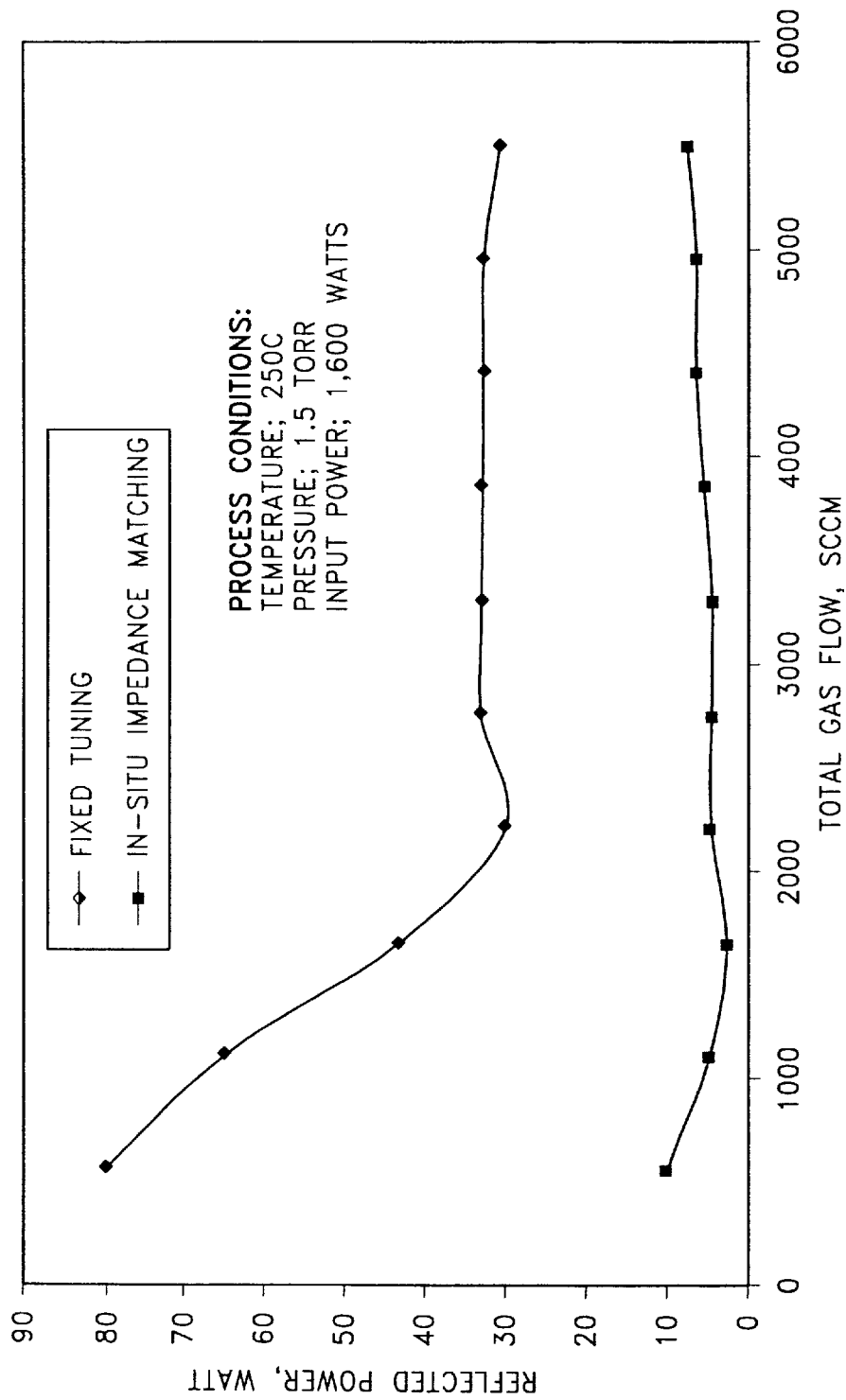
FIG. 10 is a graph illustrating reflected power against total gas flow, for both fixed tuning and dynamically or in-situ tuned impedance matching.
Figure 11:
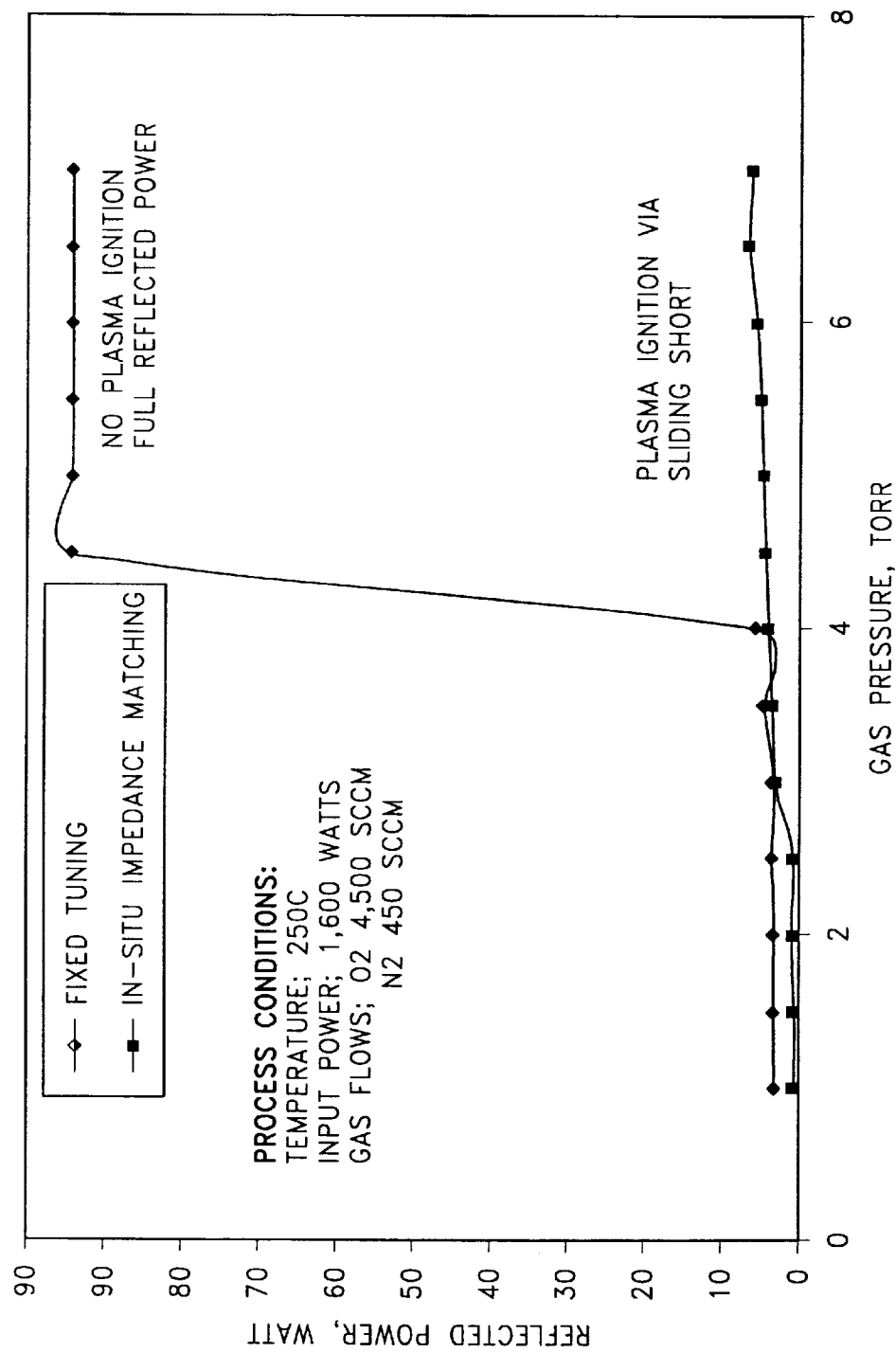
FIG. 11 is a graph illustrating reflected power against gas pressure, for both fixed tuning and dynamically or in-situ tuned impedance matching.

Dynamic closed loop control of impedance matching thus accommodates fluctuations in parameters in operation of a single process recipe. Additionally, autotuning can accommodate various process recipes. FIGS. 9–11, for example, illustrate the effect of reflected power against various process parameters, including differences in power source output, total gas flow and gas pressure. It will be understood that other process parameters, such as constituent gas makeup, will also affect reflected power. As illustrated, dynamic or in-situ impedance matching reduces losses from reflected power, relative to fixed tuning, without the downtime required for manually tuning for each different process recipe. Such autotuning is particularly advantageous for research and development of new processes, where it is desirable to test many different processes for optimization.

Microwave Choke

With reference to FIG. 1, while the autotuner module 32 minimizes the power reflected back toward the power source 22, impedance matching does not address the possibility of microwave leakage through the openings in the cavity 28 through which the applicator 40 extends upstream and downstream. Such leakage is disadvantageous for a variety of reasons discussed in the Background section above, and in U.S. Pat. No. 5,498,308 to Kamarehi et al., entitled "Plasma Asher with Microwave Trap" (hereinafter "the '308 patent"). The disclosure of the '308 patent is incorporated herein by reference.

In order to minimize this leakage, therefore, the preferred embodiments are provided with the upstream microwave choke or emission barrier 44 and the downstream microwave choke or emission barrier 46. FIGS. 4–8 show these emission barriers 44, 46 in relation to the microwave cavity 28 and the carrier tube 34, specifically in relation to the applicator section 40 of the carrier tube 34.

Figure 12:
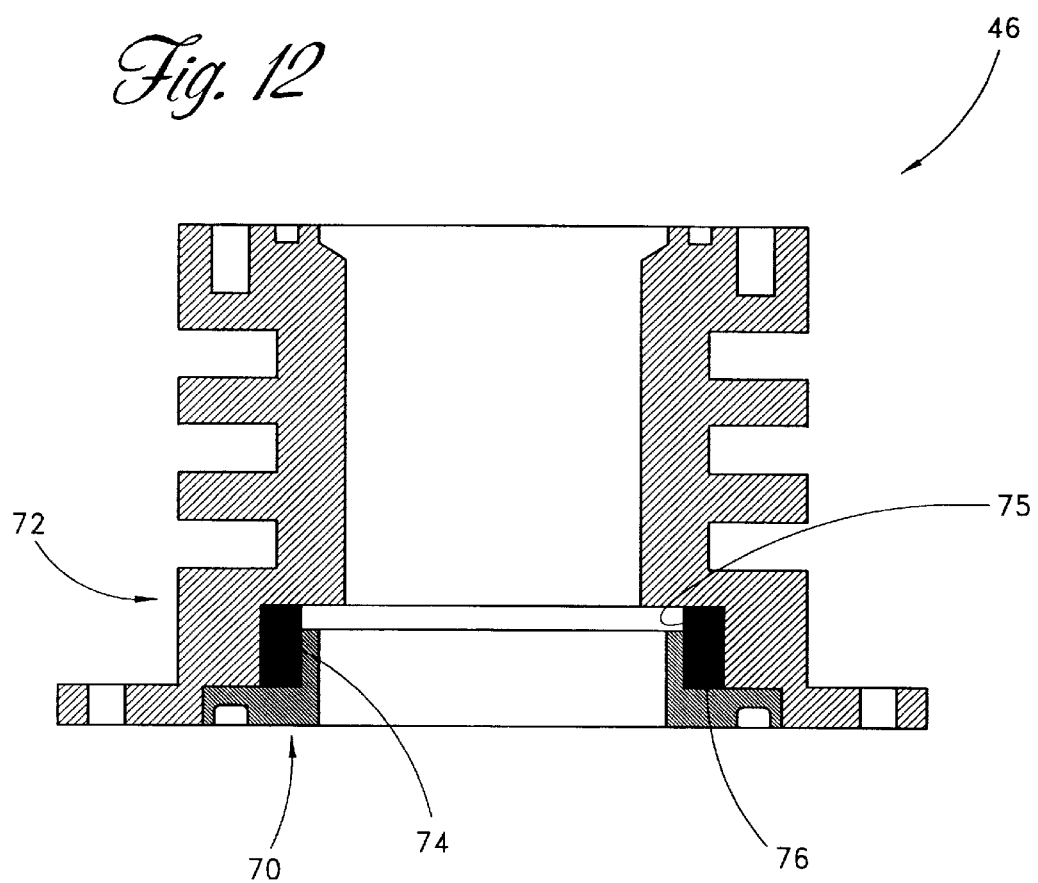
FIG. 12 is a cross-sectional view of a component of the subsystem of FIG. 4, including a low profile, co-axial microwave choke.

FIG. 12 shows the emission barrier 46 in isolation. As illustrated, the emission barrier 46 comprises an inner conductor 70, an outer conductor 72, and a dielectric medium 74. Each of these components is rectangular (see the exploded view of FIG. 6) and surrounds the applicator 40 just outside the microwave cavity 28. When assembled, the inner and outer conductors 70, 72 define a choke cavity filled with the dielectric medium 74, having a gap or opening 75 between the inner and outer conductors 70, 72 at a distal end of the choke cavity.

The inner conductor 70 and the outer conductor 72 define co-axial conductors selected to have an electrical length of a quarter of a wavelength of the microwave energy of interest. As disclosed, for example, in "Fields and Waves in Communication Electronics," Ramo, Whinnery and Van Duzer, p. 46, Table 1.23 (hereinafter, "Ramo et al.") the impedance of an ideal quarter wavelength line is given by the following formula, $$Z = \frac{Z_0^2}{Z_L}$$

where Z is the impedance of the coaxial line, $Z_0$ represents the characteristic impedance of the medium through which the electro-magnetic waves travel and $Z_L$ represents the load impedance. In the illustrated embodiment, the coaxial line is shorted across the inner conductor 70 and outer conductor 72 at the proximal end 76. As the load impedance $Z_L$ of a shorted line is ideally zero, the microwave energy propagating from the microwave cavity 28 toward the distal end of the choke 46 meets with an impedance approaching infinity at the opening 75 of the choke cavity, regardless of the characteristic impedance $Z_0$.

The high impedance of an open ended, shorted, quarter wave coaxial line can alternatively be shown by using the formula for the impedance of a shorted line, as also disclosed in Ramo et al.:

$$Z = jZ_0 \tan(\beta l)$$

The phase constant β equals 2π/λ, while the length of the line l has been selected to be a quarter wave, or λ/4. Inserting these values into the formula above, the tangent term (tan βl) becomes the tangent of π/2, which approaches infinity.

Referring again to FIG. 1, while the high impedance microwave chokes 44, 46 limit leakage of microwaves past the opening 75 of the choke cavity, the energy still propagates along the inner conductor 70 to the opening 75 of the choke. Energy thus continues to couple to the gas within the applicator 40 to this point, expanding the plasma beyond the confines of the microwave cavity 28, both upstream and downstream of the cavity 28. Such plasma expansion is disadvantageous for a number of reasons. As noted above, the expansion of plasma downstream of the cavity 28 increases the likelihood that energetic ions and/or UV radiation from plasma glow discharge will reach the process chamber 14. Moreover, the expansion of the plasma disadvantageously reduces plasma density. As will be recognized by the skilled artisan, increasing the plasma density facilitates more efficient generation of free radicals for a given power input.

Accordingly, the dielectric medium 74 is selected to have a high dielectric constant. In contrast to air (dielectric constant=1), the illustrated dielectric medium 74 preferably comprises a solid material having a dielectric constant of at least about 3.0, more preferably greater than about 5, and comprises about 9 in the illustrated embodiment. The exemplary material of the illustrated embodiment comprises a ceramic, more particularly Stycast™ Hi K, available from Emerson & Cuming.

Microwaves travel on the surface of conductors within the high dielectric medium 74, i.e., along the interior of the choke cavity. Thus, the absolute distance of a quarter wave in the exemplary ceramic is much shorter than the absolute distance of a quarter wave in air (about 1.2 inches for 2,450 MHz microwave energy). In the illustrated embodiment, a quarter wave through the ceramic translates to an absolute distance of about 0.4 inch, since the quarter wave length is proportional to the square root of the medium's dielectric constant.

The effective volume of the plasma generated within the cavity 28 and the leakage out to the opening of the choke cavity is thus reduced with increasing dielectric constant of the dielectric medium 74. Consequently, the density of the plasma is improved for a given power input, and the efficiency of radical generation improves. Improved radical generation, in turn, results in increased ash rates in the illustrated plasma ash reactor.

Segregated Plasma Sources

Figure 13:
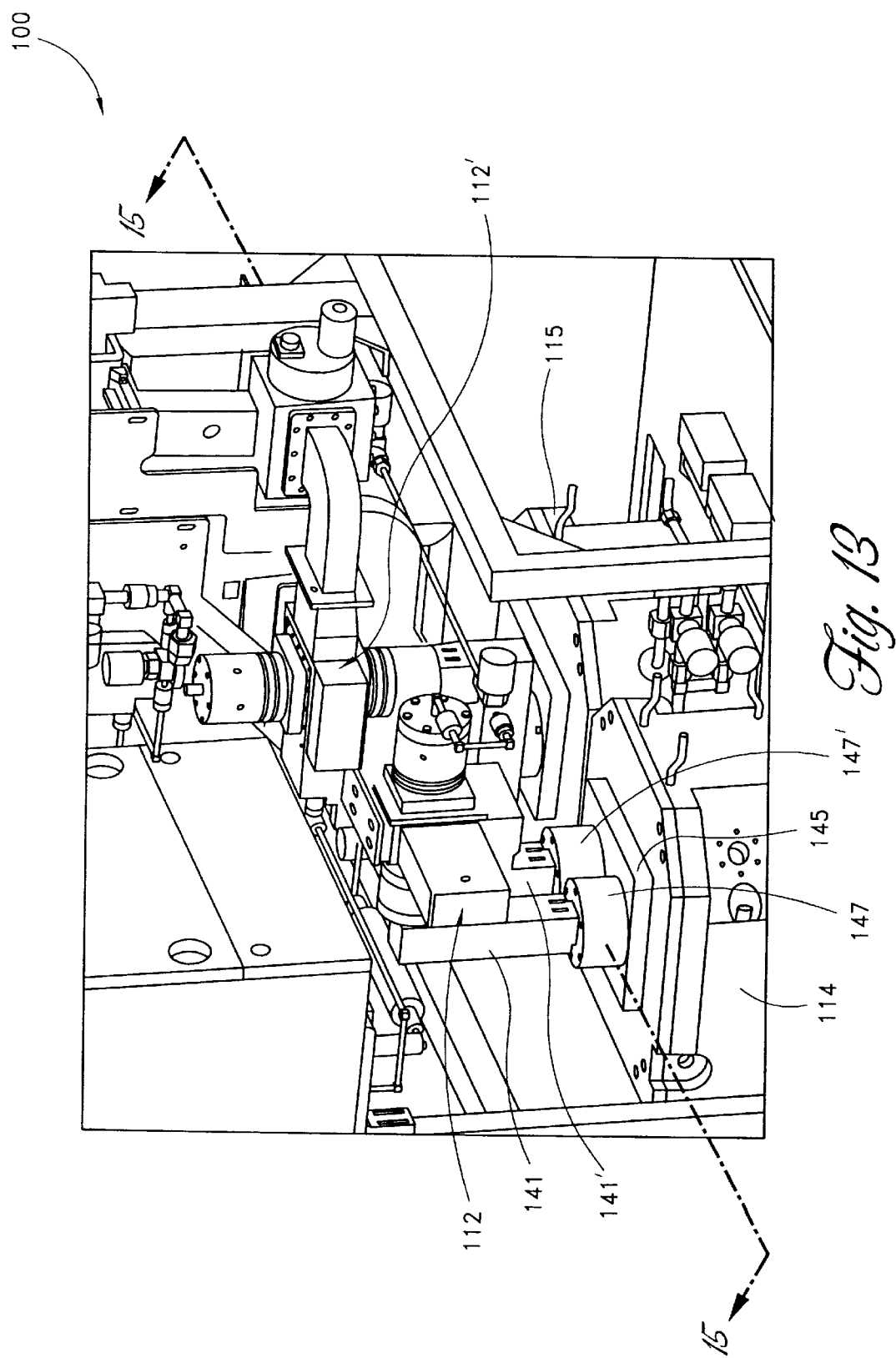
FIG. 13 is a rear, right perspective view of a semiconductor reactor incorporating dual plasma generators, constructed in accordance with a second embodiment of the present invention.
Figure 14:
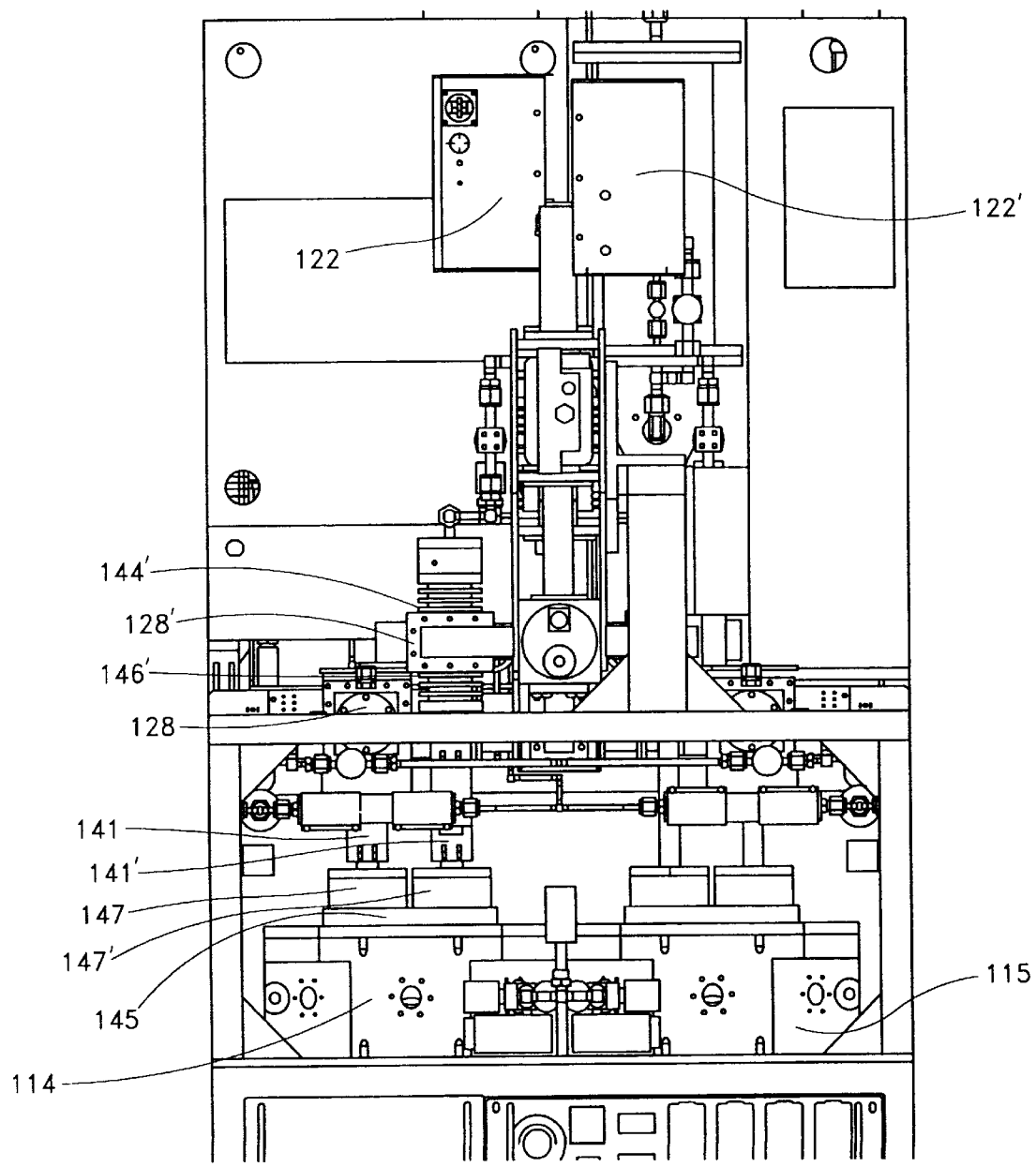
FIG. 14 is a rear elevational view of the reactor of FIG. 13.
Figure 15:
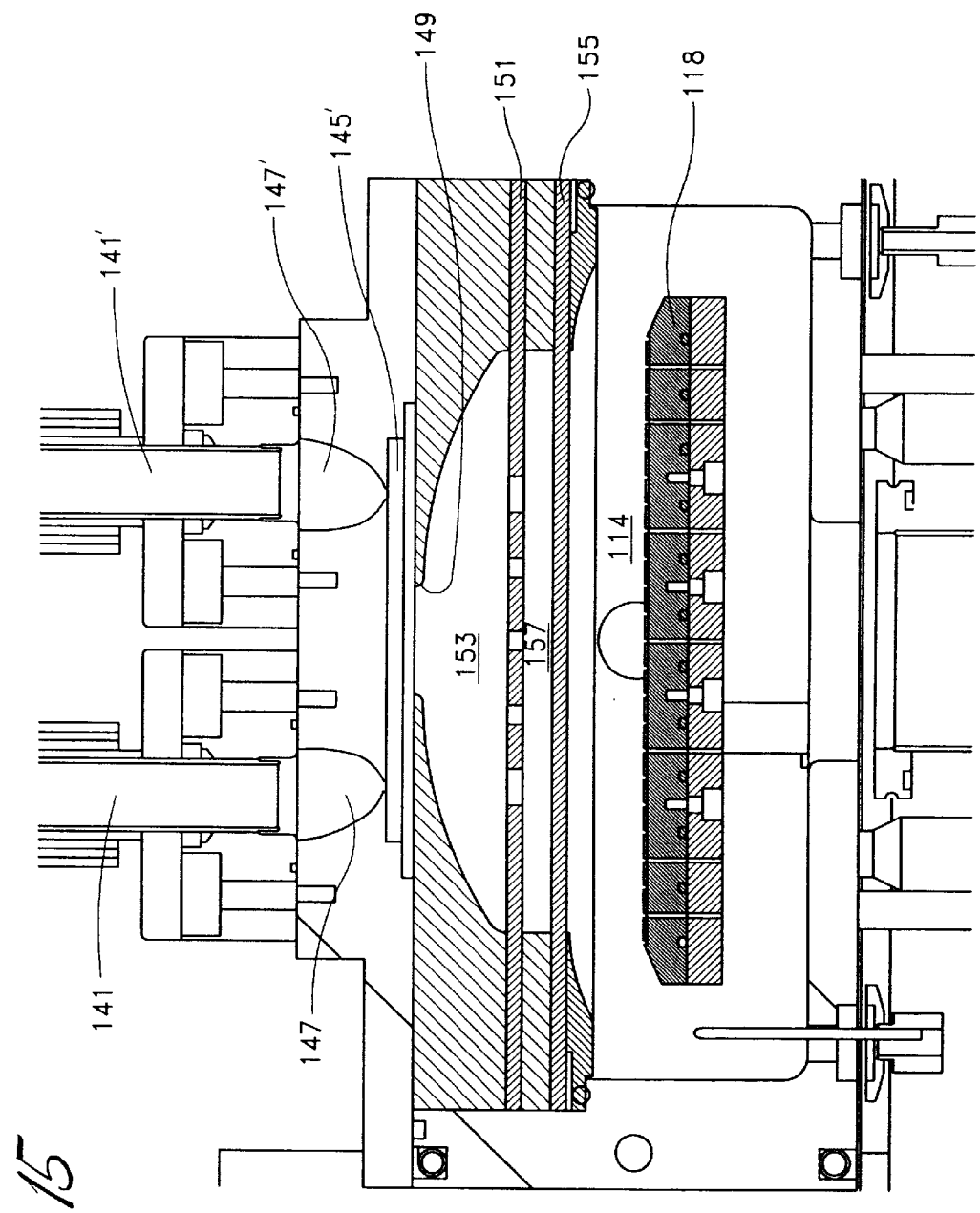
FIG. 15 is a cross-sectional view taken along lines 15—15 of FIG. 13.

FIGS. 13–15 illustrate a plasma ash reactor 100 constructed in accordance with a second embodiment of the invention. It will be understand that the reactor 100 preferably includes one or more, and more preferably all of the above-noted features of the invention. As the reactor 100 includes many features which can be similar or identical to those of the previously discussed embodiments, like features will be referred to by like reference numerals, with the addition of the number 100.

The illustrated reactor includes a first process chamber 114 and a second process chamber 115. As the two chamber 114 and 115 can have identical construction, the present description will focus on the first chamber 114 and the plasma generators associated therewith.

The chamber 114 has two plasma generators 112 and 112', each of which can have a similar construction as that disclosed above (with particular distinctions noted below). Each of the two plasma generators 112, 112' leads generated radicals, via transport tubes 141, 141' to the first process chamber 114, as shown. The free radicals from each generator are mixed, prior to introduction to the process chamber 114, in a mixer chamber 145.

With reference to FIGS. 13 and 14, it can be seen that the microwave cavities 128 and 128' of the two generators 112 and 112' are transverse to one another. This arrangement enables closer packing of the modules within the reactor frame, saving footprint on the clean room floor.

With reference to FIGS. 14 and 15, the transport tubes 141, 141' each communicate with the mixer chamber 145 via injectors 147, 147'. Advantageously, the injectors 147, 147' are configured to inject radicals tangentially near the circumference of the mixer chamber 145, thus facilitating mixing of the radicals from the two different sources 128, 128'. Most preferably, the injectors 147, 147' inject with opposite orientation, such as clockwise and counterclockwise, creating turbulence and aiding the mixture of reactive species from each of the plasma sources 128, 128'.

The interior walls of the mixer chamber 145 and the injectors 147, 147' preferably comprise anodized aluminum, but can also be fabricated of polished sapphire for improved surface smoothness. In either case, the chamber 145 preferably has the same chemical makeup as sapphire ($Al_2O_3$), which is advantageously resistant to fluorine attack. The mixer chamber 145 has a low profile, preferably less than about 1.0 inch in height, more preferably less than about 0.5 inch, and is about 0.22 inch high in the illustrated embodiment. The low profile presents less wall surface to the radicals, and thus reduced recombination of free radicals.

As shown in FIG. 15, mixer chamber 145 includes a relatively small central window 149 in the floor, opening into a first plenum chamber 153 defined above a first perforated baffle plate 151. A second baffle plate 155 below the first baffle plate 151 defines a second plenum chamber 157 between the baffle plates 151, 155. The second baffle plate 153 includes perforations (not shown) which are misaligned relative to the perforations of the first baffle plate 151. Together, the baffle plates 151, 155 ensure uniform delivery of free radicals to the process chamber 114 below.

The separate plasma generators 112, 112' advantageously enable individual optimization for different reactants. For example, the material used for the applicator and transport tubes have individual advantages and disadvantages, which tend to favor one material for a certain process recipe and another material for another process recipe. As noted above, sapphire advantageously exhibits resistance to fluorine attack. The disadvantage of sapphire, however, is that it exhibits undesirable recombination of free radicals. The table below illustrates, by way of example, the recombination coefficient ($\gamma$) of various materials.

| Material | Recombination efficiency ($\gamma$) |
|---|---|
| silver | 1.000 |
| copper | 0.708 |
| iron | 0.150 |
| nickel | 0.117 |
| aluminum oxide (sapphire) | 0.009 |
| glass (quartz) | 0.001 |
| Teflon ™ | 0.0001 |

The above table illustrates that sapphire exhibits about nine times more recombination of desirable radicals than quartz. Thus, while desirable for resisting fluorine attack, sapphire significantly reduces the efficiency of radical delivery to the process chamber.

Thus, in the illustrated dual plasma source reactor 100, the first plasma generator 112 includes a single-crystal sapphire, integral applicator 140 and transport tube 141, and is optimized for fluorine radical generation. Thus, the sapphire tube withstands fluorine attack. The second plasma generator 112' includes a quartz applicator 140' and transport tube 141', and is optimized for oxygen radical generation. Thus, the quartz tube minimizes undesirable recombination of oxygen radicals, relative to sapphire, and at the same time can withstand higher power and higher temperature plasma production than sapphire.

Accordingly, oxygen radical production is not subjected to the limitations on plasma generation imposed by fluorine corrosion, while both fluorine and oxygen radicals are introduced to the processing chamber 114. Moreover, if desirable for ashing photoresist at back-end stages of semiconductor fabrication, where the resist has not been implanted with ions, the fluorine plasma generator 112 can be turned off, and only the oxygen plasma generator 112' operated. Similarly, where only fluorine etching is desired, the oxygen plasma generator 112' can be turned off.

The skilled artisan will readily appreciate, in view of the present disclosure, application for the dual plasma source reactor for other plasma- or radical-assisted processes. In such other arrangements, it may be desirable to independently optimize features other than the material of the applicator tube, the source gas and the power level.

Figure 16:
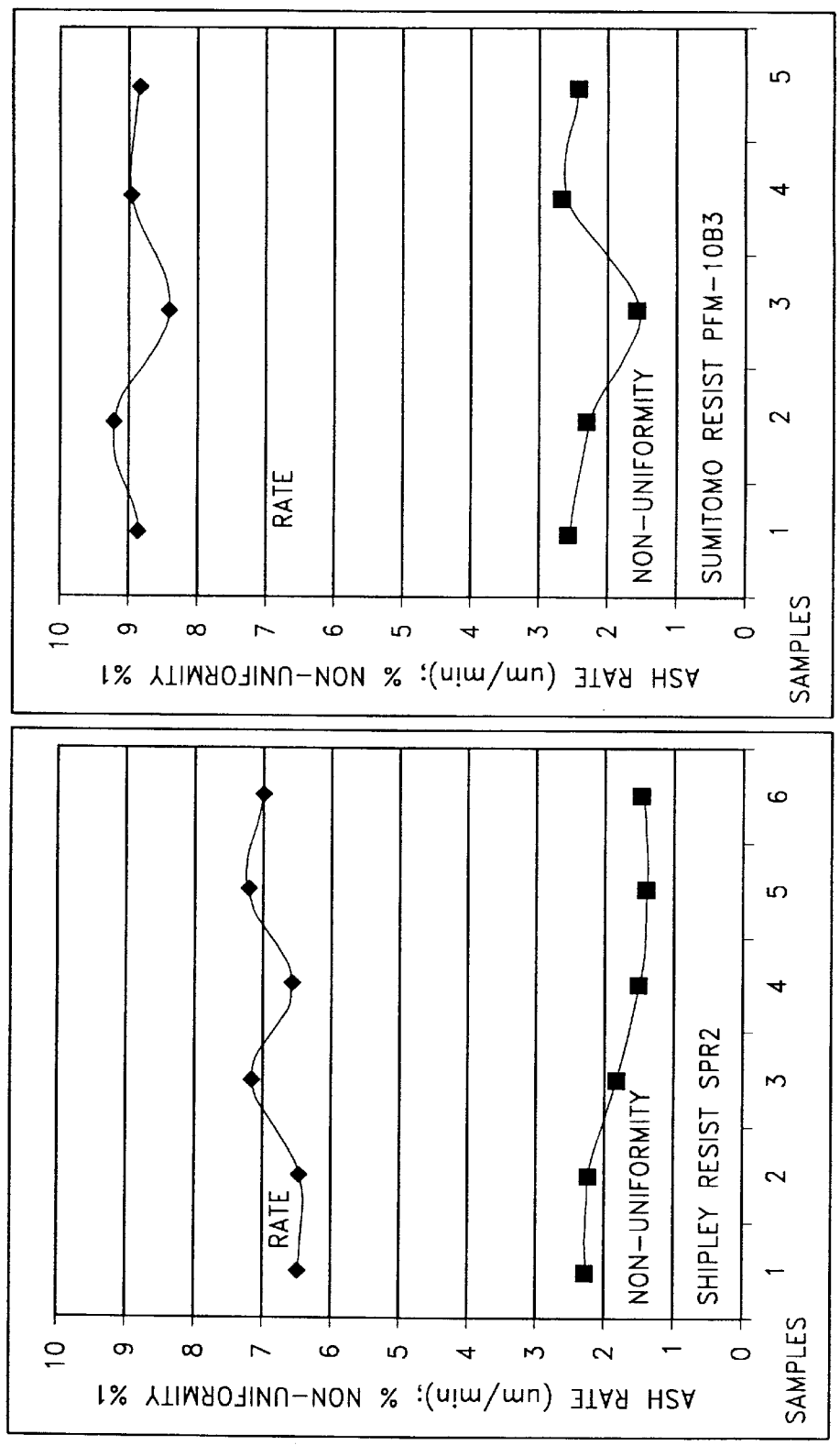
FIG. 16 is a pair of graphs illustrating ash rates and uniformity using the plasma generators of the preferred embodiments.

FIG. 16 illustrates very high plasma ash rates and uniformity obtained with the features described above. As shown, the preferred embodiments can achieve ash rates greater than about 6 μm/min , with a Shipley resist, with about 2% non-uniformity or less, and ash rates greater than about 8 μm/min with a Sumitomo resist with non-uniformity of about 2.5% or less.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

We claim:

1. A plasma generator in a semiconductor processing reactor, comprising a microwave choke including quarter-wavelength shorted coaxial conductors, the shorted coaxial conductors defining a choke enclosure, the enclosure filled with a solid material having a dielectric constant greater than about 3.

2. The plasma generator of claim 1, wherein the solid material comprises a ceramic.

3. The plasma generator of claim 1, wherein the solid material has a dielectric constant greater than about 5.

4. The plasma generator of claim 1, wherein the solid material has a dielectric constant of about 9.

5. The plasma generator of claim 1, wherein the choke enclosure surrounds a gas carrier tube at a first edge of a microwave cavity in communication with a microwave power source, the gas carrier tube passing through the microwave cavity.

6. The plasma generator of claim 5, further comprising a second choke enclosure surrounding the gas carrier tube at an opposite edge of the microwave cavity.

7. The plasma generator of claim 5, further comprising a cooling jacket surrounding the carrier tube within the cavity, the cooling jacket filled with a perfluorinated cooling fluid transparent to microwave energy.

8. The plasma generator of claim 7, wherein the cooling fluid is substantially free of hydrogen.

9. The plasma generator of claim 7, wherein the gas carrier tube comprises a sapphire section within the cavity.

10. The plasma generator of claim 9, wherein the upstream gas source comprises fluorine.

11. The plasma generator of claim 9, wherein the microwave power source can couple at least about 3,000 W of power to the gas within the microwave cavity.

12. The plasma generator of claim 9, wherein the sapphire section of the gas carrier tub extends downstream of the microwave cavity to a process chamber, the sapphire section of the tube including an elbow joint defining an angle of greater than about 35° between the microwave cavity and the process chamber.

13. The plasma generator of claim 12, wherein the elbow joint defines an angle of about 90°.

14. A remote plasma generator for generating a plasma within a gas carrier tube upstream of a process chamber, the generator comprising:
  a microwave energy generator;
  a microwave energy pathway from the generator, including:
    an isolator module in communication with the generator, the isolator module configured to protect the energy generator from reflected power;
    a waveguide communicating at a proximal end with the isolator module; and
    a microwave cavity communicating at a proximal end with a distal end of the waveguide, the cavity including a gas influence port and a radical effluent port,
  a microwave choke including quarter-wavelength shorted coaxial conductors, the shorted coaxial conductors defining a choke enclosure surrounding the gas carrier tube at an edge of the microwave cavity, the enclosure filled with a solid material having a dielectric constant greater than about 3;
  a sliding short defining a variable distal end of the microwave cavity, the sliding short dynamically controlled to match impedance of the microwave cavity with the waveguide.

15. The remote plasma generator of claim 14, wherein the solid material has a dielectric constant greater than about 5.

16. The remote plasma generator of claim 15, wherein the solid material has a dielectric constant of about 9.

17. The remote plasma generator of claim 14, wherein the microwave energy pathway includes a directional coupler measuring reflected energy directed toward the microwave energy generator, the directional coupler generating signals controlling movement of the sliding short.

18. The remote plasma generator of claim 14, wherein preset tuning is conducted via a fixed tuning knob within the waveguide and fine tuning is conducted dynamically by the sliding short.

19. A dual plasma source downstream reactor, comprising:
  a first plasma source cavity;
  a first plasma energy source coupled to the plasma source cavity;
  a first gas carrier tube extending through the first plasma source cavity;
  a first microwave choke including quarter-wavelength shorted coaxial conductors, the shorted coaxial conductors defining a first choke enclosure surrounding the first gas carrier tube at each of an upstream edge and a downstream edge of the first plasma source cavity, each first choke enclosure filled with a solid material having a dielectric constant greater than about 3;
  a second plasma source cavity;
  a second plasma energy source coupled to the plasma source cavity;
  a second gas carrier tube extending through the first plasma source cavity;
  a second microwave choke including quarter-wavelength shorted coaxial conductors, the shorted coaxial conductors defining a second choke enclosure surrounding the second gas carrier tube at each of an upstream edge and a downstream edge of the second plasma source cavity, each second choke enclosure filled with a solid material having a dielectric constant greater than about 3;
  a plasma mixer chamber in fluid communication with each of the first gas carrier tube and the second gas carrier tube downstream of first and second plasma source cavities; and a process chamber downstream of and in fluid communication with the mixer chamber.

20. The plasma generator of claim 19, wherein the solid material within each of the first and second choke enclosures has a dielectric constant greater than about 5.

21. The plasma generator of claim 20, wherein the solid material within each of the first and second choke enclosures has a dielectric constant of about 9.

22. The reactor of claim 19, further comprising a first perforated baffle plate positioned between the process chamber and the mixer chamber.

23. The reactor of claim 19, further comprising a second perforated baffle plate positioned between the process chamber and the mixer chamber, wherein the first and second baffle plates have non-aligned perforations.

24. The reactor of claim 19, wherein the first gas carrier tube comprises sapphire and the second gas carrier tube comprises quartz.

25. The reactor of claim 24, wherein the first gas carrier tube communicates with a source of fluorine and the second gas carrier tube communicates with a source of oxygen.

* * * * *